(12) United States Patent
Kim et al.

(10) Patent No.: US 12,431,875 B1
(45) Date of Patent: Sep. 30, 2025

(54) RING OSCILLATORS BASED ON FEEDBACK FIELD-EFFECT TRANSISTORS

(71) Applicant: Korea University Research and Business Foundation, Seoul (KR)

(72) Inventors: Sang Sig Kim, Seoul (KR); Kyoung Ah Cho, Seoul (KR); Jae Min Son, Seongnam-si (KR); Ju Hee Jeon, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 18/777,253

(22) Filed: Jul. 18, 2024

(30) Foreign Application Priority Data

Mar. 28, 2024 (KR) .................. 10-2024-0042687

(51) Int. Cl.
*H03K 3/03* (2006.01)
(52) U.S. Cl.
CPC ................. *H03K 3/0315* (2013.01)
(58) Field of Classification Search
CPC ...... H03K 3/03; H03K 3/0315; H03K 19/017; H03K 19/01714; H03K 19/0013
See application file for complete search history.

(56) References Cited

U.S. PATENT DOCUMENTS

| | | | |
|---|---|---|---|
| 10,978,487 B2 * | 4/2021 | El Dirani | H03K 19/09421 |
| 2022/0006448 A1 * | 1/2022 | Kim | H10D 64/27 |
| 2023/0012345 A1 * | 1/2023 | Kim | H03K 19/0013 |

FOREIGN PATENT DOCUMENTS

| | | |
|---|---|---|
| KR | 10-2014-0096598 A | 8/2014 |
| KR | 10-2200488 B1 | 1/2021 |
| KR | 10-2023-0011092 A | 1/2023 |
| KR | 10-2023-0020840 A | 2/2023 |
| KR | 10-2023-0053195 A | 4/2023 |

OTHER PUBLICATIONS

Son, Jaemin, et al. "Generation and Storage of Random Voltage Values via Ring Oscillators Comprising Feedback Field-Effect Transistors." Nanomaterials 14.7, 562, Mar. 23, 2024. (pp. 1-9).
Park, Young-Soo, et al., "Inverting logic-in-memory cells comprising silicon nanowire feedback field-effect transistors", Nanotechnology, Mar. 9, 2021, (10 Pages in English).
Korean Office Action Issued on Jul. 15, 2025, in Counterpart Korean Patent Application No. 10-2024-0042687 (6 Pages in English, 6 Pages in Korean).

* cited by examiner

*Primary Examiner* — Jeffrey M Shin
(74) *Attorney, Agent, or Firm* — NSIP Law

(57) ABSTRACT

The feedback field-effect transistor-based ring oscillator includes a plurality of feedback field-effect transistors each in which a diode structure is present as an n-type doped channel region and a p-type doped channel region between a drain terminal and a source terminal, a gate terminal is present in the diode structure, wherein the plurality of feedback field-effect transistors operates as p-channel mode when the gate terminal is present on the n-type doped channel region and operates as n-channel mode when the gate terminal is present on the p-type doped channel region, and in a plurality of inverters formed by the plurality of feedback field-effect transistor, an output terminal of an inverter of each stage is input to an input terminal of a next stage and an oscillation operation is performed based on supply voltage applied through the drain terminal and the source terminal.

11 Claims, 12 Drawing Sheets

700

RING OSCILLATORS BASED ON FEEDBACK FIELD-EFFECT TRANSISTORS

CROSS-REFERENCE TO RELATED APPLICATION(S)

This application claims priority from and the benefit of Korean Patent Application No. 10-2024-0042687 filed on Mar. 28, 2024, which is hereby incorporated by reference in its entirety.

BACKGROUND

1. Field

Example embodiments relate to a feedback field-effect transistor-based ring oscillator and, more particularly, to technology for implementing a ring oscillator configured to generate and store a random number based on random voltage generation within the oscillation range based on a feedback field-effect transistor that performs a memory function and a switching function based on a positive feedback loop.

2. Related Art

Considering an increase in data-intensive applications, such as 5G communication standard, Internet of things (IoT), and artificial intelligence (AI), after the Fourth Industrial Revolution, a new computer paradigm is essential for large data processing requirements.

To solve the aforementioned issues, research on logic-in-memory (LIM) technology in which computation and memory functions are combined is focused and accelerated.

The LIM technology performs a computation function of a processor and a memory function of memory in the same space and thus, may reduce latency and power consumption occurring during data transmission and may significantly improve system integration.

The conventional LIM technology has been actively researched based on static random access memory (SRAM) and dynamic RAM corresponding to volatile memory devices, and resistive RAM (ReRAM), magnetoresistive RAM (MRAM), and phase-change RAM (PCRAM) corresponding to non-volatile memory devices.

Along with next-generation memory technology, a modern computing system continues to evolve with data-centric applications, such as artificial intelligence (AI) and IoT.

However, such applications digitize a lot of data and store the same in memory, which may make the data vulnerable to cyberattacks due to easy data access.

Although software-based data security algorithm technology has been continuously researched to overcome data security vulnerability issues, there are still structural security issues, such as bus probing and algorithm pattern leakage.

Meanwhile, to solve such issues, research on technology related to a hardware-based true random number generator (TRNG) and a physical unclonable function (PUF) is being accelerated.

Since TRNG and PUF techniques use device process variables or stochastic mechanisms, they are physically unclonable, which may lead to improving a system security level.

Techniques using the conventional ferroelectric random-access memory (FRAM), ReRAM, and MRAM have difficulty in being applied for TRNG and PUF related technology that requires a large number of operation cycles during a short period of time due to poor device uniformity and stability.

Also, since a generated encryption key is stored in a memory array in which a data access is easy, it is vulnerable to memory hacking.

SUMMARY

An example embodiment is to implement a ring oscillator that performs random number generation and storage based on random voltage generation within the oscillation range, based on a feedback field-effect transistor that performs all of a memory function and a switching function based on a positive feedback loop.

An example embodiment is to provide true random number generator (TRNG) and physical unclonable function (PUF) implementation technology that simultaneously performs pure random number generation and storage functions using a feedback field-effect transistor that has excellent device stability and performs a switching function and a memory function in a single device.

An example embodiment is to improve a data security issue in a data-centric application, such as artificial intelligence (AI) and Internet of things (IoT) and to implement a single ring oscillator that performs all of an oscillation function and a memory function using a feedback field-effect transistor with excellent stability to which an existing complementary metal-oxide semiconductor (CMOS) manufacturing process is applicable.

An example embodiment is to implement a ring oscillator available for next-generation artificial intelligence computing technology by reducing standby power using an excellent memory characteristic of a feedback field-effect transistor and by increasing computational efficiency with low power consumption through an excellent switching characteristic.

According to an example embodiment, there is provided a feedback field-effect transistor-based ring oscillator including a plurality of feedback field-effect transistors each in which a diode structure is present as an n-type doped channel region and a p-type doped channel region between a drain terminal and a source terminal, a gate terminal is present in the diode structure, an operating state is determined in response to occurrence of a latch-up phenomenon or a latch-down phenomenon by a positive feedback loop in the channel region based on different voltages applied to the drain terminal and the gate terminal, respectively, and a memory characteristics that remembers a memory state is implemented as holes or electrons accumulate in a potential well in the channel region due to the positive feedback loop, wherein the plurality of feedback field-effect transistors operates as p-channel mode when the gate terminal is present on the n-type doped channel region and operates as n-channel mode when the gate terminal is present on the p-type doped channel region, and two different channel modes of feedback field-effect transistors operate as a single inverter, and in a plurality of inverters formed by the plurality of feedback field-effect transistor, an output terminal of an inverter of each stage is input to an input terminal of a next stage and an oscillation operation is performed based on supply voltage applied through the drain terminal and the source terminal.

A single inverter among the plurality of inverters may include two different channel modes of feedback field-effect transistors, a p-channel feedback field-effect transistor and an n-channel feedback field-effect transistor, and may have a structure in which each gate terminal is connected to an input terminal, and a source terminal of the p-channel feedback field-effect transistor and a drain terminal of the n-channel feedback field-effect transistor are connected to an output terminal, and may be configured to output an output voltage to the output terminal in response to drain supply voltage supplied to the drain terminal, source supply voltage supplied to the source terminal, and input voltage input to the input terminal, and to, when the drain supply voltage is positive voltage and the source supply voltage is negative voltage, perform an inverter operation and output the output voltage in which the input voltage is inverted.

A single inverter among the plurality of inverters may be configured to, when application of the drain supply voltage, the source supply voltage, and the input voltage is interrupted, perform a memory function of holding output voltage before the application is interrupted.

In the n-channel feedback field-effect transistor, when the source supply voltage is negative voltage and when gate voltage increases in a positive voltage direction, the latch-up phenomenon may occur due to the positive feedback loop and when the gate voltage decreases in a negative voltage direction, the positive feedback loop may be interrupted and the latch-down phenomenon may occur.

In the p-channel feedback field-effect transistor, when the drain supply voltage is positive voltage and when gate voltage increases in a negative voltage direction, the latch-up phenomenon may occur due to the positive feedback loop and when the gate voltage decreases in a positive voltage direction, the positive feedback loop may be interrupted and the latch-down phenomenon may occur.

The plurality of inverters may be configured to, when drain supply voltage supplied to the drain terminal is positive voltage and source supply voltage supplied to the source terminal is negative voltage, perform an inverter operation and perform the oscillation operation accordingly.

The drain supply voltage may be applied at 1.2V to 1.4V, and the source supply voltage may be applied at −1.2V to −1.4V.

The plurality of inverters may be configured to increase a speed of the oscillation operation in response to an increase in the drain supply voltage and the source supply voltage.

The plurality of inverters may be configured to continue the oscillation operation when the drain supply voltage and the source supply voltage are applied, to perform a hold operation of holding and outputting an output value being output to an output terminal before interruption when application of the drain supply voltage and the source supply voltage is interrupted, to resume the oscillation operation when the drain supply voltage and the source supply voltage are applied again, and to generate a random output value within the oscillation range every hold operation when the interruption and the resume are repeated.

The plurality of inverters may include a semi/non-volatile characteristic of storing a random number by storing the random output value based on the memory characteristic.

The plurality of inverters may be formed at the valley and the ridge of oscillation based on probabilistic density of random output values according to the hold operation as an oscillation waveform according to the oscillation operation is similar to a sine wave, and may be configured to divide probability distribution in the probabilistic density into a positive logic operation value and a negative logic operation value based on reference voltage and to output the random output value such that a ratio of the positive logic operation value and the negative logic operation value is close to 1:1.

According to some example embodiments, it is possible to implement a ring oscillator that performs random number generation and storage based on random voltage generation within the oscillation range, based on a feedback field-effect transistor that performs all of a memory function and a switching function based on a positive feedback loop.

According to some example embodiments, it is possible to provide TRNG and PUF implementation technology that simultaneously performs pure random number generation and storage functions using a feedback field-effect transistor that has excellent device stability and performs a switching function and a memory function in a single device.

According to some example embodiments, it is possible to improve a data security issue in a data-centric application, such as artificial intelligence and IoT and to implement a single ring oscillator that performs all of an oscillation function and a memory function using a feedback field-effect transistor with excellent stability to which an existing CMOS manufacturing process is applicable.

According to some example embodiments, it is possible to implement a ring oscillator available for next-generation artificial intelligence computing technology by reducing standby power using an excellent memory characteristic of a feedback field-effect transistor and by increasing computational efficiency with low power consumption through an excellent switching characteristic.

Further areas of applicability will become apparent from the description provided herein. The description and specific examples in this summary are intended for purposes of illustration only and are not intended to limit the scope of the present disclosure.

BRIEF DESCRIPTION OF THE FIGURES

Embodiments will be described in more detail with regard to the figures, wherein like reference numerals refer to like parts throughout the various figures unless otherwise specified, and wherein.

DETAILED DESCRIPTION

Figure 1A:
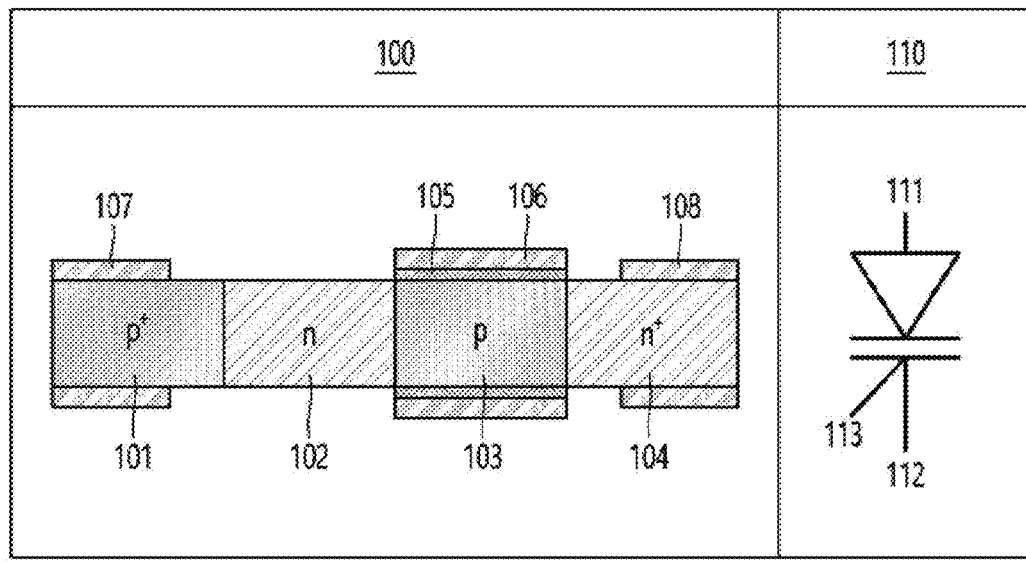
FIGS. 1A and 1B illustrate examples of describing a structure and circuit symbols of a feedback field-effect transistor constituting a ring oscillator according to an example embodiment.

Hereinafter, various example embodiments will be described with reference to the accompanying drawings.

The example embodiments and the terms used herein are not construed to limit technology described herein to specific implementations and should be understood to include various modifications, equivalents, and/or substitutions of corresponding example embodiments.

When it is determined that detailed description related to a relevant known function or configuration may make the disclosure unnecessarily ambiguous in describing various example embodiments in the following, the detailed description will be omitted.

The following terms refer to terms defined in consideration of functions of various example embodiments and may differ depending on a user, the intent of an operator, or custom. Accordingly, the terms should be defined based on the overall contents in the present specification.

In relation to explaining drawings, like reference numerals refer to like elements.

The singular forms "a," "an," and "the" are intended to include the plural forms as well, unless the context clearly indicates otherwise.

Herein, expressions, such as "A or B" and "at least one of A and/or B," may include all possible combinations of listed items.

Expressions, such as "first," "second," etc., may describe corresponding components regardless of order or importance and may be simply used to distinguish one component from another component and do not limit the corresponding components.

When it is described that one (e.g., first) component is "(functionally or communicatively) connected" or "accessed" to another (e.g., second) component, the component may be directly connected to the other component or may be connected thereto through still another component (e.g., third component).

Herein, "configured (or set) to ~" may be interchangeably used with, for example, "suitable for ~," "having capability of ~," "changed to ~," "made to ~," "capable of ~," or "designed to ~" in a hardware manner or a software manner, depending on situations.

In a situation, the expression "device configured to ~" may represent that the device is "capable of" interworking with another device or parts.

For example, the phrase "processor configured (or set) to perform A, B, and C" may refer to a dedicated processor (e.g., embedded processor) for performing a corresponding operation or a general-purpose processor (e.g., central processing unit (CPU) or application processor) capable of performing corresponding operations by executing one or more software programs stored in a memory device.

Also, the term "or" represents "inclusive or" rather than "exclusive or."

That is, unless otherwise stated or clear from the context, the expression "x uses a or b" represents any one of natural inclusive permutations.

The terms "~ unit," "~er/or," etc. used in the following represent a unit of processing at least one function or operation, and may be implemented by hardware or software or combination of hardware and software.

Figure 1B:
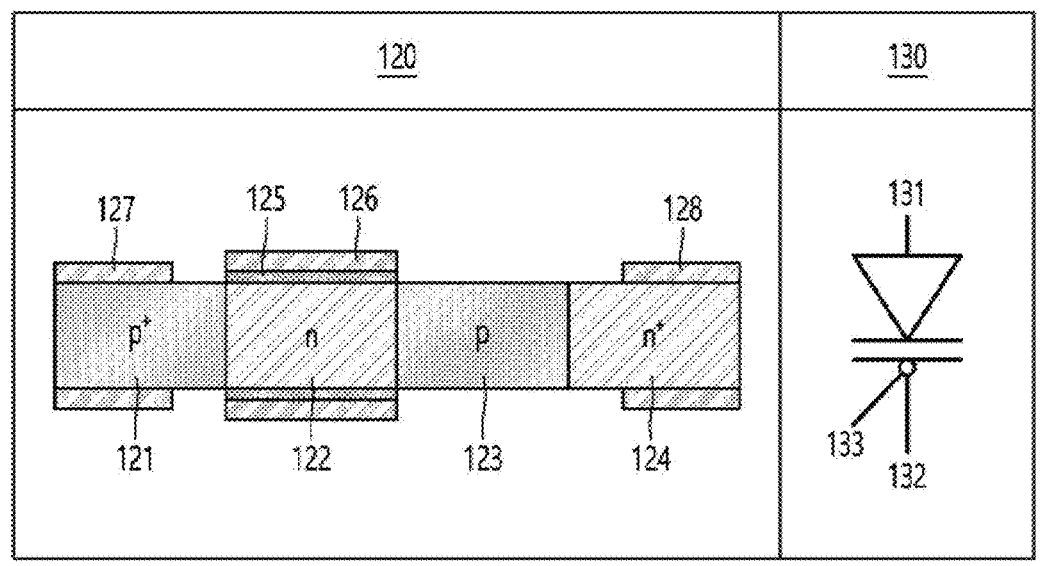

FIGS. 1A and 1B illustrate examples of describing a structure and circuit symbols of a feedback field-effect transistor constituting a ring oscillator according to an example embodiment.

FIGS. 1A and 1B illustrate a structure and circuit symbols of a feedback field-effect transistor constituting a ring oscillator according to an example embodiment.

Referring to FIG. 1A, in a feedback field-effect transistor 100 constituting a ring oscillator according to an example embodiment, a channel region between a drain region 101 and a source region 104 includes a first channel region 102 and a second channel region 103.

In this structure, a gate insulating film 105 is present on the second channel region 103 and a gate terminal 106 is present on the gate insulating film 105.

Also, a drain terminal 107 is present on the drain region 101 and a source terminal 108 is present on the source region 104.

For example, the feedback field-effect transistor 100 refers to a complementary metal-oxide semiconductor (CMOS) process-based silicon feedback field-effect transistor and includes a drain terminal, a source terminal, and a gate terminal.

The feedback field-effect transistor 100 may generate steep switching phenomena of latch-up and latch-down through a positive feedback operation mechanism of electrons and holes.

The feedback field-effect transistor 100 may be turned ON based on a latch-up phenomenon and may be turned OFF based on a latch-down phenomenon through a positive feedback operation.

The feedback field-effect transistor 100 may have a memory characteristic that holes or electrons accumulate in a potential well in response to progress of a positive feedback loop.

The feedback field-effect transistor 100 may operate as an n-channel feedback field-effect transistor as the gate insulating film 105 and the gate terminal 106 are present on the second channel region 103.

As the second channel region 103 operates as an n-type doped source region based on gate voltage applied through the gate terminal 106 present on the second channel region 103, the feedback field-effect transistor 100 may also be referred to as the n-channel feedback field-effect transistor.

The gate insulating film 105 and the gate terminal 106 are formed to surround the second channel region 103.

In circuit symbols 110 of the feedback field-effect transistor 100 constituting the ring oscillator, a channel region is present between a drain terminal 111 and a source terminal 112 and a gate terminal 113 is connected thereto.

Referring to FIG. 1B, in a feedback field-effect transistor 120 constituting a ring oscillator according to an example embodiment, a channel region between a drain region 121 and a source region 124 includes a first channel region 122 and a second channel region 123.

In this structure, a gate insulating film 125 is present on the first channel region 122 and a gate terminal 126 is present on the gate insulating film 125.

Also, a drain terminal 127 is present on the drain region 121 and a source terminal 128 is present on the source region 124.

The feedback field-effect transistor 120 may operate as a p-channel feedback field-effect transistor as the gate insulating film 125 and the gate terminal 126 are present on the first channel region 122.

As the first channel region 122 operates as a p-type doped drain region based on gate voltage applied through the gate terminal 126 present on the first channel region 122, the feedback field-effect transistor 120 may also be referred to as the p-channel feedback field-effect transistor.

The gate insulating film 125 and the gate terminal 126 are formed to surround the first channel region 122.

In circuit symbols 130 of the feedback field-effect transistor 120 constituting the ring oscillator according to an example embodiment, a channel region is present between a drain terminal 131 and a source terminal 132 and a gate terminal 133 is connected thereto.

If the ring oscillator is implemented using the feedback field-effect transistor 100 and the feedback field-effect transistor 120, random number generation and storage may be simultaneously implemented.

The feedback field-effect transistor 100 and the feedback field-effect transistor 120 may be used to implement a true random number generator (TRNG) and a physical unclonable function (PUF).

For example, a feedback field-effect transistor according to an example embodiment may include one of a feedback field-effect transistor using a single gate, a feedback field-effect transistor using a double gate, and a feedback field-effect transistor using a triple gate.

Figure 2:
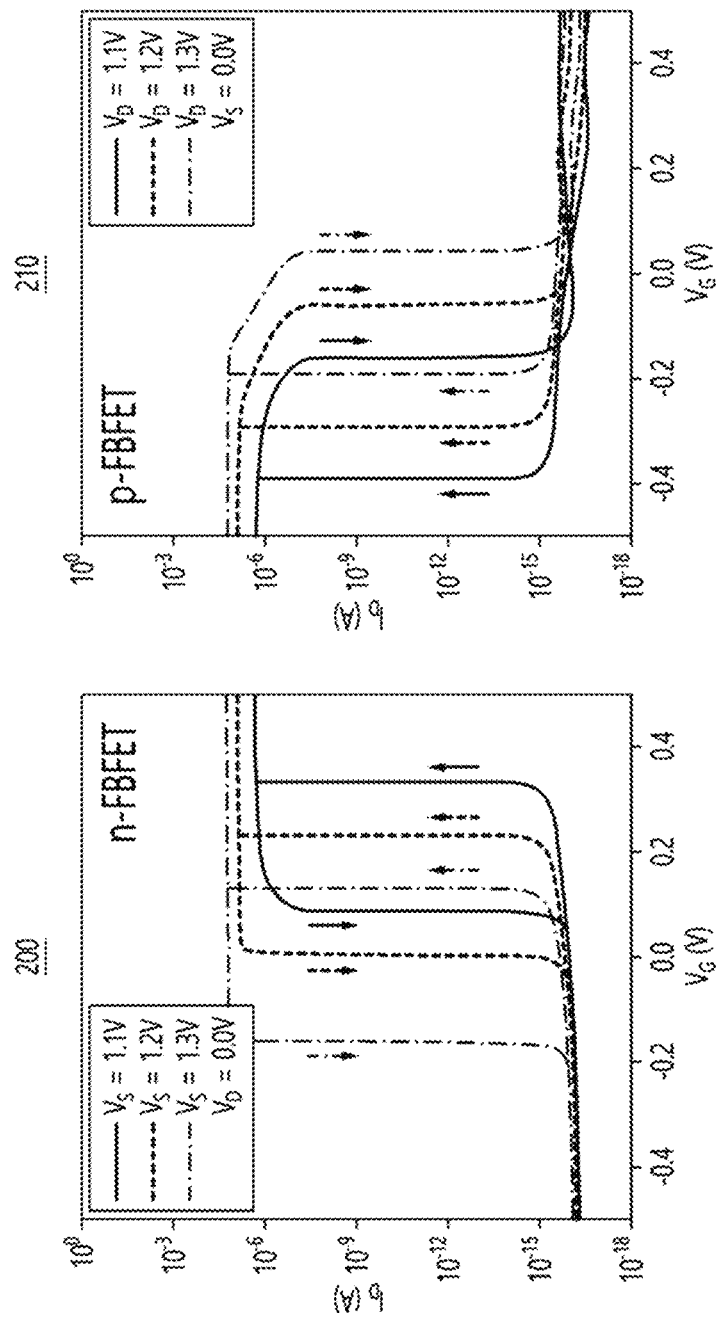
FIG. 2 illustrates an example of describing an electrical characteristic of a feedback field-effect transistor constituting a ring oscillator according to an example embodiment.

FIG. 2 illustrates an example of describing an electrical characteristic of a feedback field-effect transistor constituting a ring oscillator according to an example embodiment.

FIG. 2 illustrates an electrical characteristic of a feedback field-effect transistor constituting a ring oscillator according to an example embodiment.

Referring to FIG. 2, a graph 200 may show an electrical characteristic of an n-channel feedback field-effect transistor and a graph 210 may show an electrical characteristic of a p-channel feedback field-effect transistor.

Referring to the graph 200, when gate voltage (VG) increases in a positive direction in a state in which source supply voltage (Vs) is applied as negative voltage to a source terminal of the n-channel feedback field-effect transistor, a latch-up phenomenon occurs due to a positive feedback loop.

In the n-channel feedback field-effect transistor, when the source supply voltage is negative voltage and when the gate voltage increases in a positive voltage direction, the latch-up phenomenon occurs due to the positive feedback and when the gate voltage decreases in a negative voltage direction, the positive feedback loop is interrupted and a latch-down phenomenon.

When the gate voltage decreases in a negative direction in a state in which the negative voltage is applied to the source terminal of the n-channel feedback field-effect transistor, the latch-down phenomenon occurs due to interruption of the positive feedback loop.

Referring to the graph 210, when gate voltage (VG) increases in a negative direction in a state in which drain supply voltage (VD) is applied as positive voltage to a drain terminal of the p-channel feedback field-effect transistor, a latch-up phenomenon occurs due to a positive feedback loop.

When the gate voltage decreases in a positive direction in a state in which the positive voltage is applied to the drain terminal of the p-channel feedback field-effect transistor, a latch-down phenomenon occurs due to interruption of the positive feedback loop.

In the p-channel feedback field-effect transistor, when the drain supply voltage is positive voltage and when the gate voltage increases in a negative voltage direction, the latch-up phenomenon occurs due to the positive feedback loop and when the gate voltage decreases in a positive voltage direction, the positive feedback loop is interrupted and the latch-down phenomenon occurs.

Both the n-channel feedback field-effect transistor and the p-channel feedback field-effect transistor show a bistable memory characteristic as electrons or holes accumulate in response to progress of the positive feedback loop.

The n-channel feedback field-effect transistor and the p-channel feedback field-effect transistor may simultaneously perform random number generation and storage functions while constituting the ring oscillator using switching and memory characteristics.

Figure 3A:
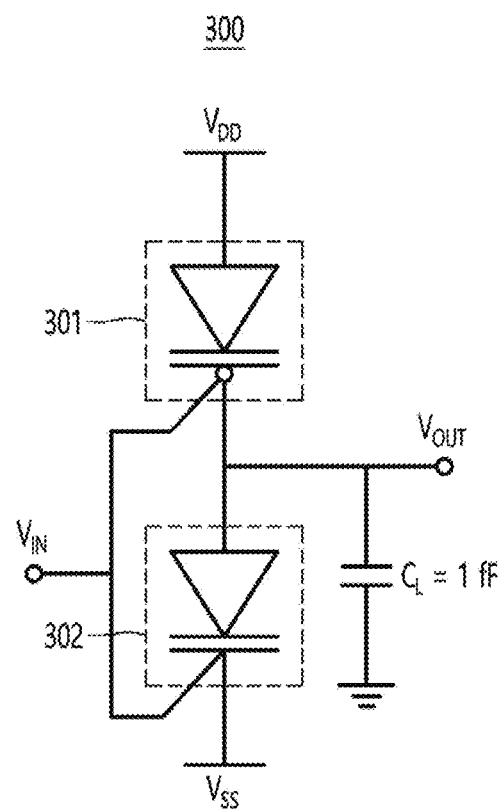
FIGS. 3A and 3B illustrate examples of describing an inverter structure using a feedback field-effect transistor and an electrical characteristic thereof according to an example embodiment.
Figure 3B:
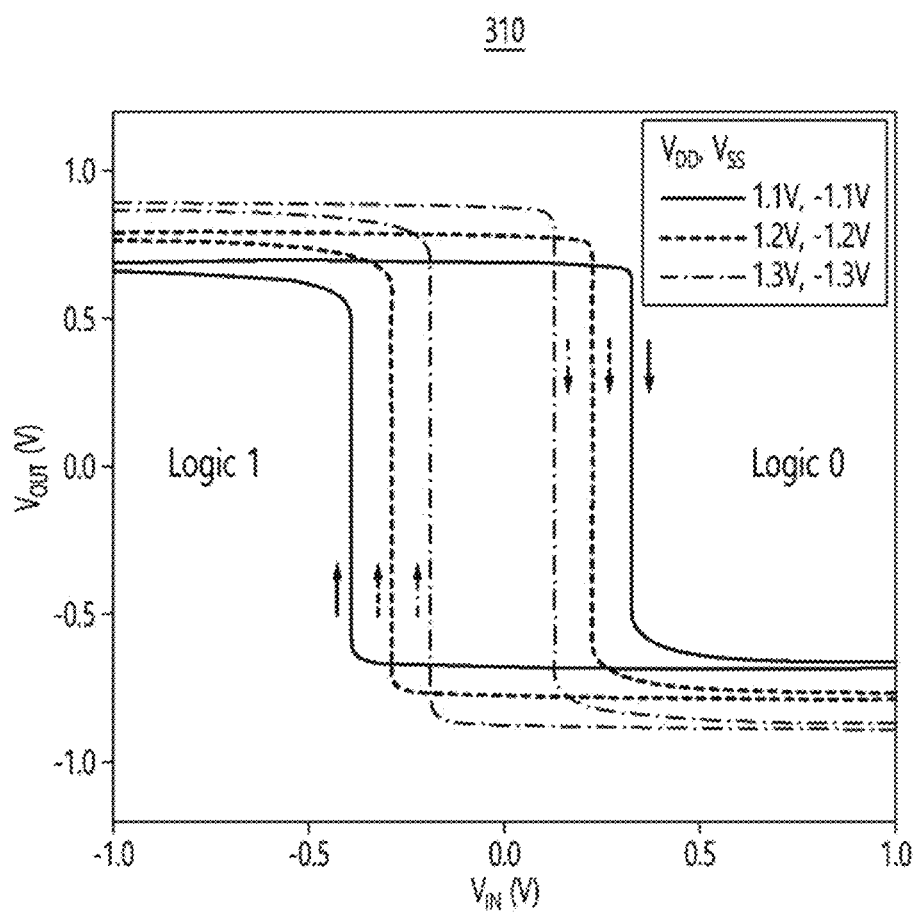

FIGS. 3A and 3B illustrate examples of describing an inverter structure using a feedback field-effect transistor and an electrical characteristic thereof according to an example embodiment.

FIG. 3A illustrates an inverter structure using a feedback field-effect transistor according to an example embodiment.

Referring to FIG. 3A, an inverter 300 according to an example embodiment includes two different channel modes of feedback field-effect transistors, a p-channel feedback field-effect transistor 301 and an n-channel feedback field-effect transistor 302.

A gate terminal of each of the p-channel feedback field-effect transistor 301 and the n-channel feedback field-effect transistor 302 is connected to an input terminal ($V_{IN}$).

In this structure, a source terminal of the p-channel feedback field-effect transistor 301 and a drain terminal of the n-channel feedback field-effect transistor 302 are connected to an output terminal ($V_{OUT}$).

The inverter 300 outputs output voltage to the output terminal in response to drain supply voltage ($V_{DD}$) supplied to the drain terminal, source supply voltage ($V_{SS}$) supplied to the source terminal, and input voltage input to the input terminal.

When the drain supply voltage is positive voltage and the source supply voltage is negative voltage, the inverter 300 may perform an inverter and may output the output voltage in which the input voltage is inverted.

FIG. 3B illustrates an electrical characteristic of an inverter structure using a feedback field-effect transistor according to an example embodiment.

Referring to FIG. 3B, a graph 310 shows a logic operation result, "1," and a logic operation result, "0," as a result of applying supply voltage ($V_{DD}$) and supply voltage ($V_{SS}$) to a drain terminal of a p-channel feedback field-effect transistor and a source terminal of an n-channel feedback field-effect transistor, respectively, during a logic operation and operating a result of output voltage ($V_{OUT}$) according to input voltage ($V_{IN}$).

The graph 310 shows that, when positive $V_{DD}$ and negative $V_{SS}$ are applied to the inverter, $V_{OUT}$ is inverted according to $V_{IN}$ and thereby output.

Here, due to a memory characteristic of a constituent transistor, a bistable memory characteristic appears even in a voltage transfer characteristic of the inverter, which makes it sure that it is possible to simultaneously perform a logic operation and a memory function using the same.

Figure 4:
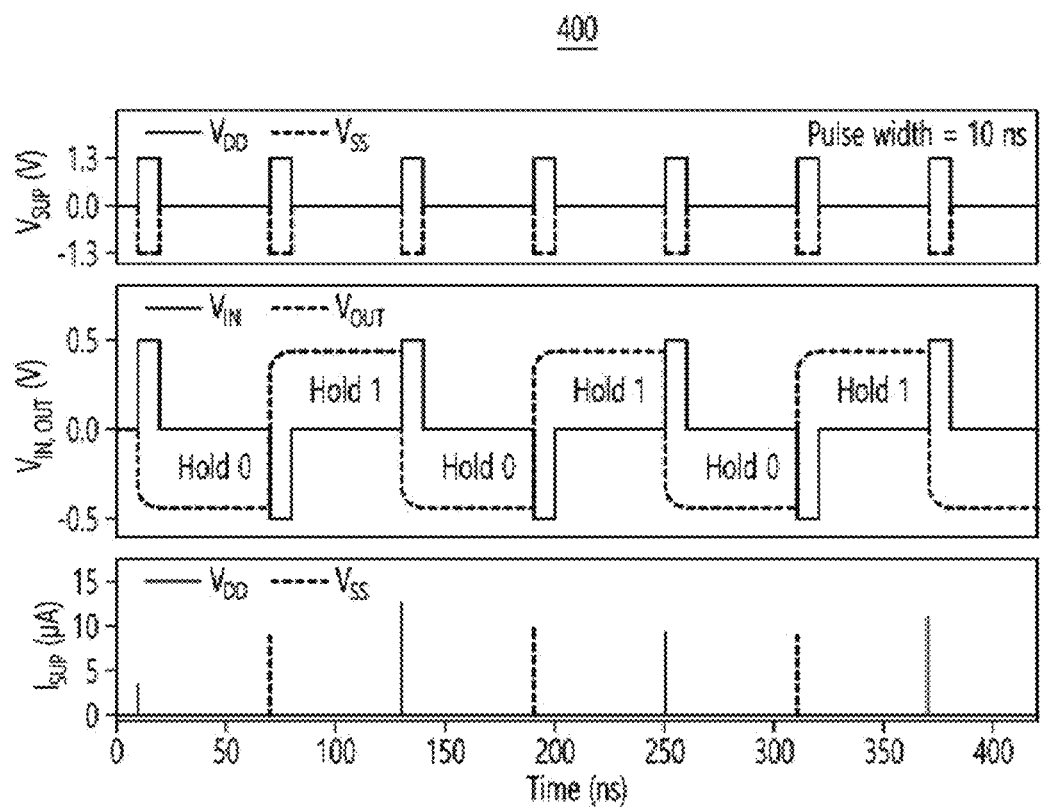
FIG. 4 illustrates an example of describing a logic operation and a memory characteristic of an inverter using a feedback field-effect transistor according to an example embodiment.

FIG. 4 illustrates an example of describing a logic operation and a memory characteristic of an inverter using a feedback field-effect transistor according to an example embodiment.

FIG. 4 illustrates a logic operation and a memory characteristic of an inverter using a feedback field-effect transistor according to an example embodiment.

Referring to FIG. 4, a graph 400 is a timing diagram showing a logic operation and a memory characteristic of an inverter configured with a feedback field-effect transistor.

According to the graph 400, when an input pulse for a logic operation is applied in a state in which positive $V_{DD}$ and negative $V_{SS}$ are applied, the inverter configured with the feedback field-effect transistor may perform an inverter operation.

When positive $V_{IN}$ corresponding to a logic operation result, "1," is applied, negative $V_{OUT}$ corresponding to "0" is computed, and when negative $V_{IN}$ corresponding to "0" is applied, positive $V_{OUT}$ corresponding to "1" is computed.

When supply voltage ($V_{DD}$ and $V_{SS}$) and $V_{IN}$ are removed after the input pulse is applied, the inverter performs a memory function of holding a previously computed logic value.

According to an example embodiment, when application of drain supply voltage, source supply voltage, and input voltage is interrupted, the inverter may perform the memory function of holding output voltage before the application is interrupted.

Figure 5A:
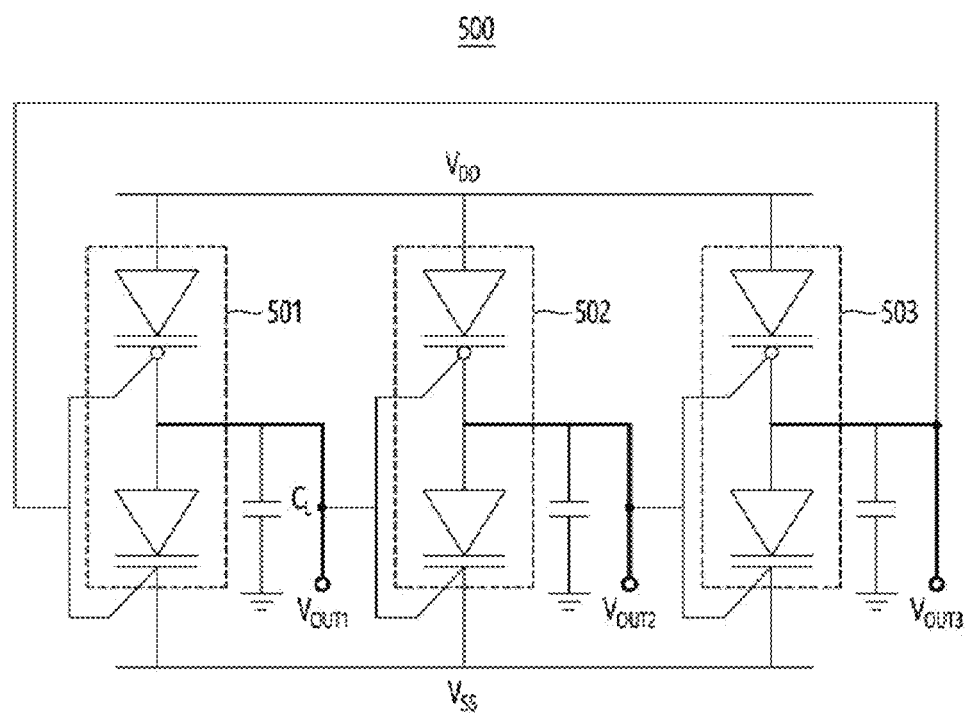
FIGS. 5A and 5B illustrate examples of describing a circuit structure and an output result of a ring oscillator configured with a feedback field-effect transistor according to an example embodiment.
Figure 5B:
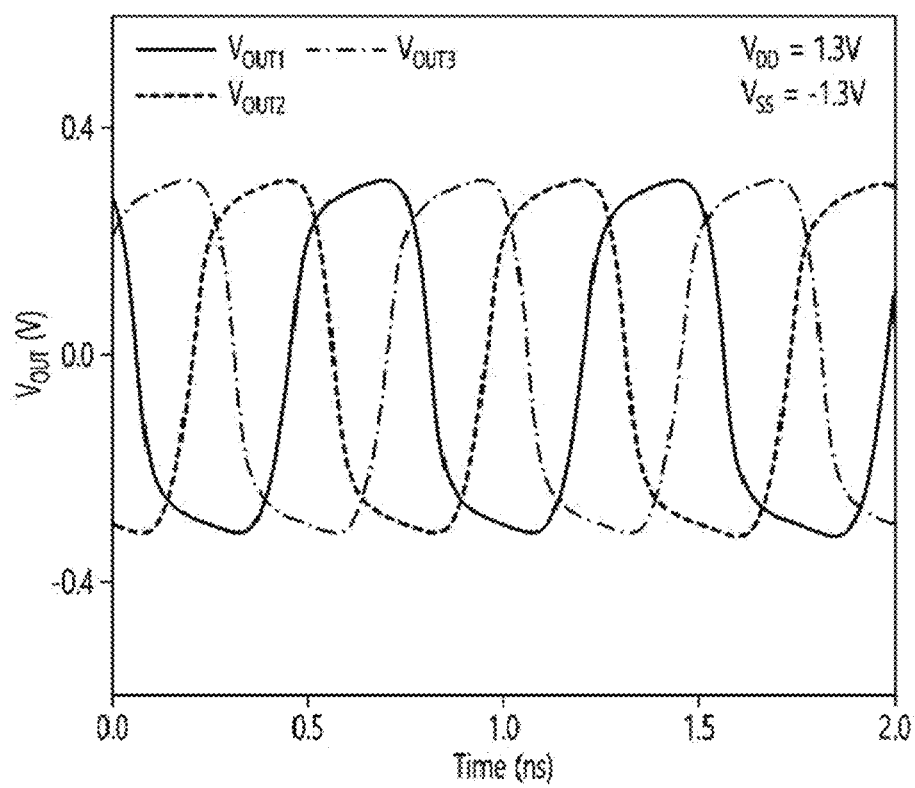

FIGS. 5A and 5B illustrate examples of describing a circuit structure and an output result of a ring oscillator configured with a feedback field-effect transistor according to an example embodiment.

FIG. 5A illustrates a circuit structure and an operation characteristic of a ring oscillator configured with a feedback field-effect transistor according to an example embodiment.

Referring to FIG. 5A, a ring oscillator 500 configured with a feedback field-effect transistor according to an example embodiment includes a plurality of feedback field-effect transistors each in which a diode structure is present as an n-channel region and a p-channel region between a drain terminal and a source terminal, a gate terminal is present in the diode structure, an operating state is determined in response to occurrence of a latch-up phenomenon or a latch-down phenomenon by a positive feedback loop in the channel region based on different voltages applied to the drain terminal and the gate terminal, respectively, and a memory characteristics that remembers a memory state is implemented as holes or electrons accumulate in a potential well in the channel region due to the positive feedback loop.

The plurality of feedback field-effect transistors operates as p-channel mode when the gate terminal is present on the n-type doped channel region and operates as n-channel mode when the gate terminal is present on the p-type doped channel region, and two different channel modes of feedback field-effect transistors operate as a single inverter.

In a plurality of inverters formed by the plurality of feedback field-effect transistor, an output terminal of an inverter of each stage is input to an input terminal of a next stage and an oscillation operation may be performed based on supply voltage applied through the drain terminal and the source terminal.

The plurality of inverters includes a first inverter 501, a second inverter 502, and a third inverter 503.

The first inverter 501, the second inverter 502, and the third inverter 503 include two different channel modes of feedback field-effect transistors, a p-channel feedback field-effect transistor and an n-channel feedback field-effect transistor. Here, each gate terminal is connected to an input terminal, a source terminal of the p-channel feedback field-effect transistor and a drain terminal of the n-channel feedback field-effect transistor are connected to an output terminal.

The first inverter 501, the second inverter 502, and the third inverter 503 may output an output voltage to the output terminal in response to drain supply voltage supplied to the drain terminal, source supply voltage supplied to the source terminal, and input voltage input to the input terminal, and here, may perform an inverter operation and output the output voltage in which the input voltage is inverted when the drain supply voltage is positive voltage and the source supply voltage is negative voltage.

The first inverter 501 outputs first output voltage ($V_{OUT1}$), the second inverter 502 outputs second output voltage ($V_{OUT2}$), and the third inverter 503 outputs third output voltage ($V_{OUT3}$).

When the drain supply voltage supplied to the drain terminal is positive voltage and the source supply voltage supplied to the source terminal is negative voltage, the first inverter 501, the second inverter 502, and the third inverter 503 may perform the inverter operation and perform an oscillation operation accordingly.

FIG. 5B illustrates output voltage in a circuit structure of a ring oscillator configured with a feedback field-effect transistor according to an example embodiment.

Referring to FIG. 5B, a graph 510 shows the first output voltage ($V_{OUT1}$) of the first inverter 501, the second output voltage ($V_{OUT2}$) of the second inverter 502, and the third output voltage ($V_{OUT3}$) of the third inverter 503.

The graph 510 shows a transient output characteristic when drain supply voltage ($V_{DD}$) applied to the ring oscillator is 1.3V and source supply voltage ($V_{SS}$) is −1.3V.

Each stage of output node voltage shows self-sustaining oscillation ranging from −0.4V to 0.4V with a phase deviation of $2\pi/3$ during oscillation.

It can be regarded to be caused due to $\pi/3$ phase deviation of each inverter and x phase deviation by static inversion.

An example embodiment may implement a ring oscillator that performs random number generation and storage based on random voltage generation within the oscillation range, based on a feedback field-effect transistor that performs all of a memory function and a switching function based on a positive feedback loop.

Figure 6:
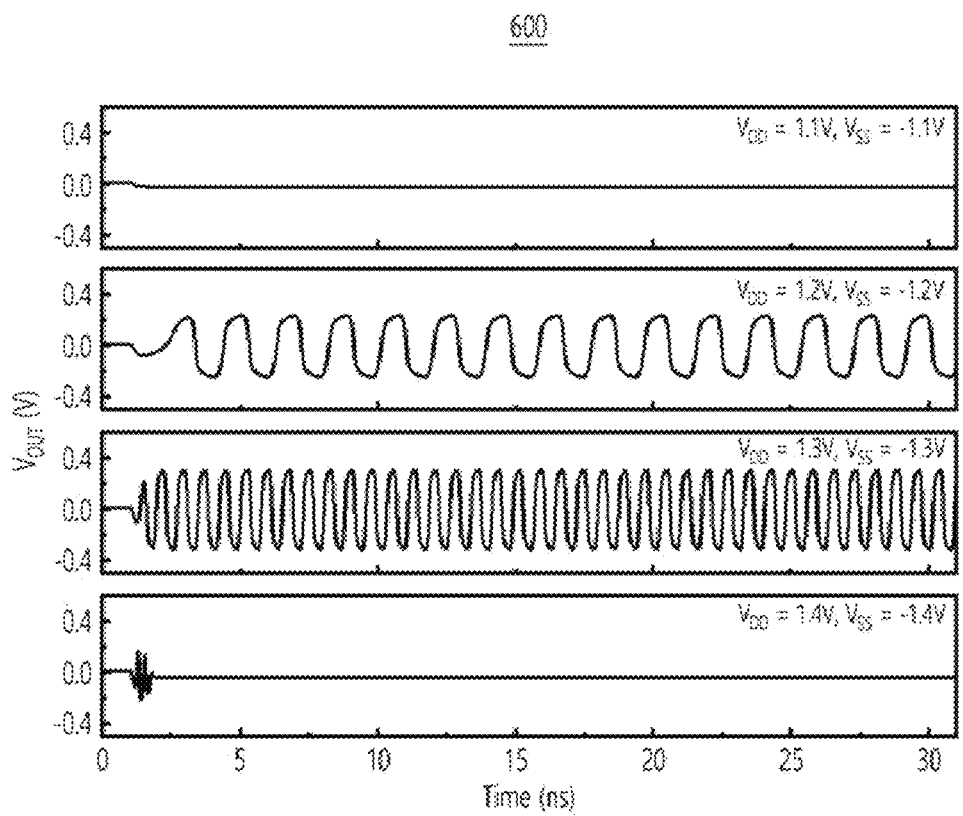
FIG. 6 illustrates an example of describing an electrical characteristic of a ring oscillator configured with a feedback field-effect transistor according to an example embodiment.

FIG. 6 illustrates an example of describing an electrical characteristic of a ring oscillator configured with a feedback field-effect transistor according to an example embodiment.

FIG. 6 illustrates an electrical characteristic of a ring oscillator configured with a feedback field-effect transistor according to an example embodiment.

Referring to FIG. 6, a graph 600 shows a transient output characteristic of the ring oscillator at various supply voltages.

When supply voltage, for example, positive drain supply voltage ($V_{DD}$) and negative source supply voltage ($V_{SS}$), is applied, the ring oscillator configured with the feedback field-effect transistor performs an oscillation operation.

According to the graph 600, since the ring oscillator performs an oscillation operation only when voltage exceeding the memory window range of each stage inverter is output, sufficient supply voltage ($V_{DD} \geq 1.2$ V, $V_{SS} \leq -1.2$ V) needs to be applied.

Meanwhile, when excessive supply voltage ($V_{DD} \geq 1.4$ V, $V_{SS} \leq -1.4$ V) is applied, all of p-channel and n-channel feedback field-effect transistors constituting the circuit are turned ON and thus, the oscillation operation is stopped.

In the ring oscillator, drain supply voltage may be applied at 1.2V to 1.4V and source supply voltage may be applied at −1.2V to −1.4V.

In response to an increase in the drain supply voltage and the source supply voltage, a plurality of inverters constituting the ring oscillator may increase a speed of the oscillation operation.

That is, since the oscillation speed increases according to an increase in supply voltage, the ring oscillator may be used as a voltage-controlled oscillator.

Figure 7:
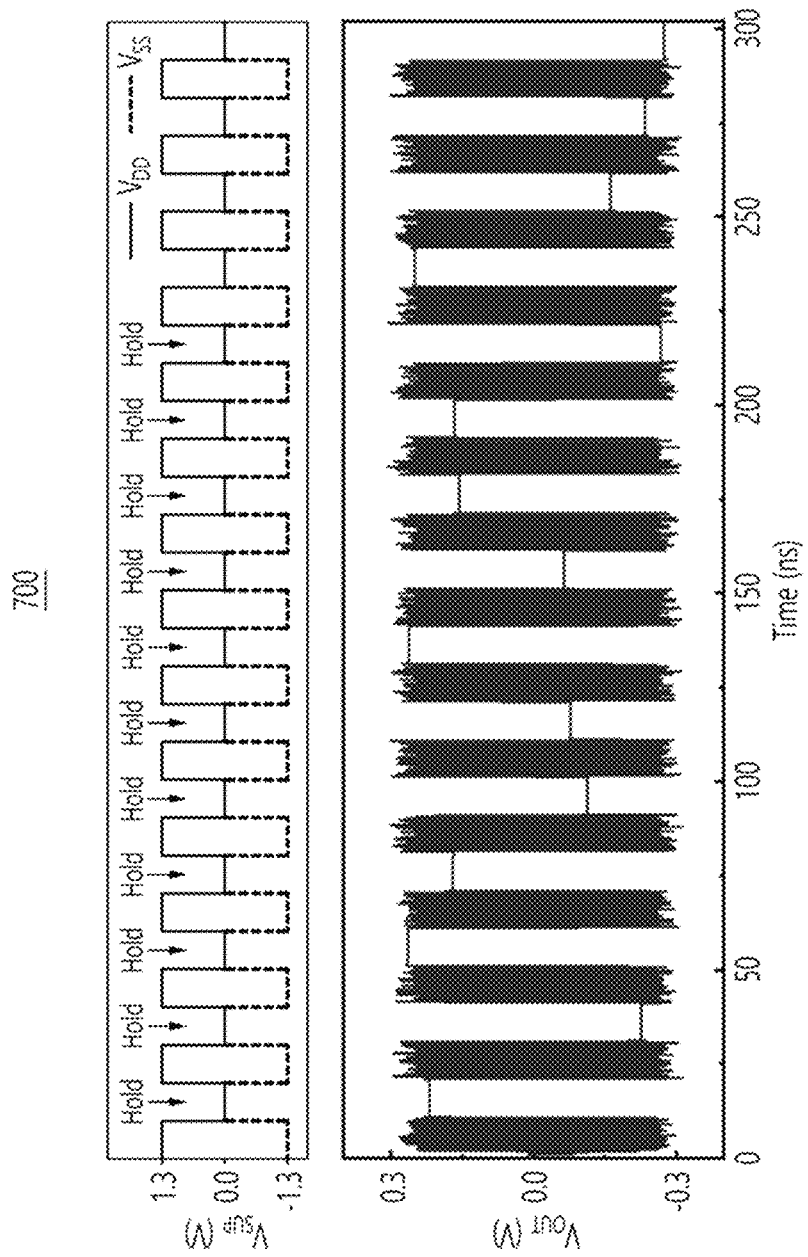
FIG. 7 illustrates an example of describing a random number generation characteristic of a ring oscillator configured with a feedback field-effect transistor according to an example embodiment.

FIG. 7 illustrates an example of describing a random number generation characteristic of a ring oscillator configured with a feedback field-effect transistor according to an example embodiment.

FIG. 7 illustrates a random number generation characteristic of a ring oscillator configured with a feedback field-effect transistor according to an example embodiment.

Referring to FIG. 7, a graph 700 shows a result of continuing oscillation when supply voltage ($V_{DD}$, $V_{SS}$) is applied to the ring oscillator and outputting a previous $V_{OUT}$ value when the supply voltage is removed.

Here, a state in which the supply voltage is removed may be defined as a "hold" state and when the supply voltage is applied again, an oscillation operation is performed.

When applying and removing supply voltage to the ring oscillator is repeated, a random $V_{OUT}$ value is generated within the oscillation range for each hold operation.

That is, a plurality of inverters according to an example embodiment continues the oscillation operation when drain supply voltage and source supply voltage are applied, and performs a hold operation of holding and outputting an output value being output to an output terminal before interruption when application of the drain supply voltage and the source supply voltage is interrupted (removed).

Also, the plurality of inverters may resume the oscillation operation when the drain supply voltage and the source supply voltage are applied again, and may generate a random output value within the oscillation range every hold operation when the interruption and the resume are repeated.

Therefore, the ring oscillator may generate a random number using switching and memory functions of the feedback field-effect transistor constituting the circuit.

Figure 8A:
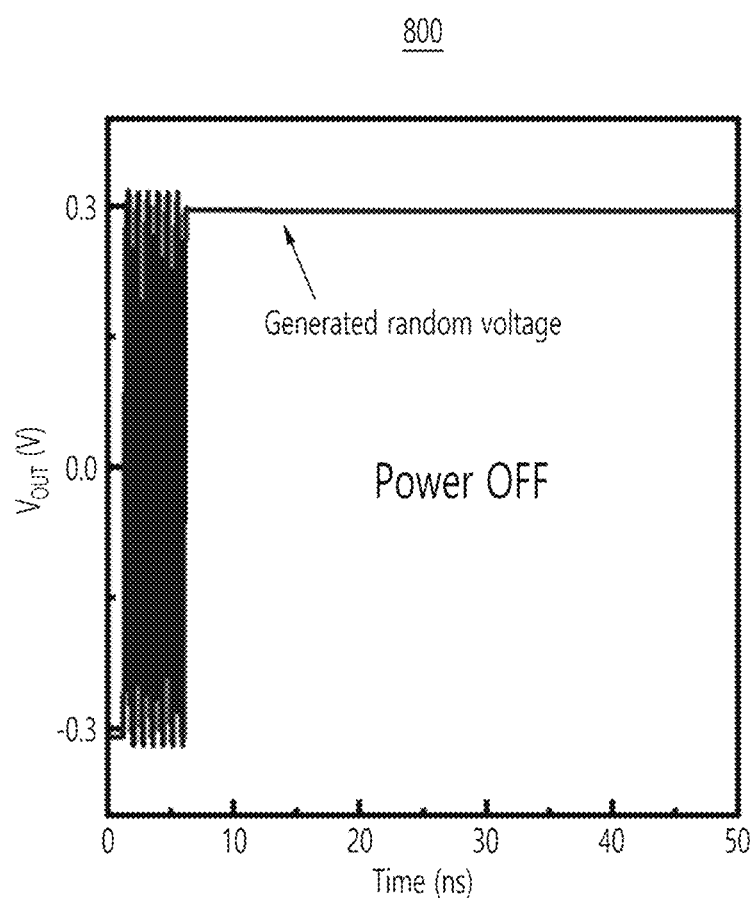
FIG. 8A illustrates an example of describing a random number storage function of a ring oscillator configured with a feedback field-effect transistor according to an example embodiment.

FIG. 8A illustrates an example of describing a random number storage function of a ring oscillator configured with a feedback field-effect transistor according to an example embodiment.

FIG. 8A illustrates a random number storage function of a ring oscillator configured with a feedback field-effect transistor according to an example embodiment.

Referring to FIG. 8A, a graph 800 shows that the ring oscillator may generate a random number and, at the same, store a value inside a circuit since drain supply voltage and source supply voltage are removed.

Since drain supply voltage and source supply voltage are removed, the ring oscillator holds random numbers at the same voltage level.

That is, the plurality of inverters may include a semi/non-volatile characteristic of storing a random number by storing a random output value based on a memory characteristic.

Figure 8B:
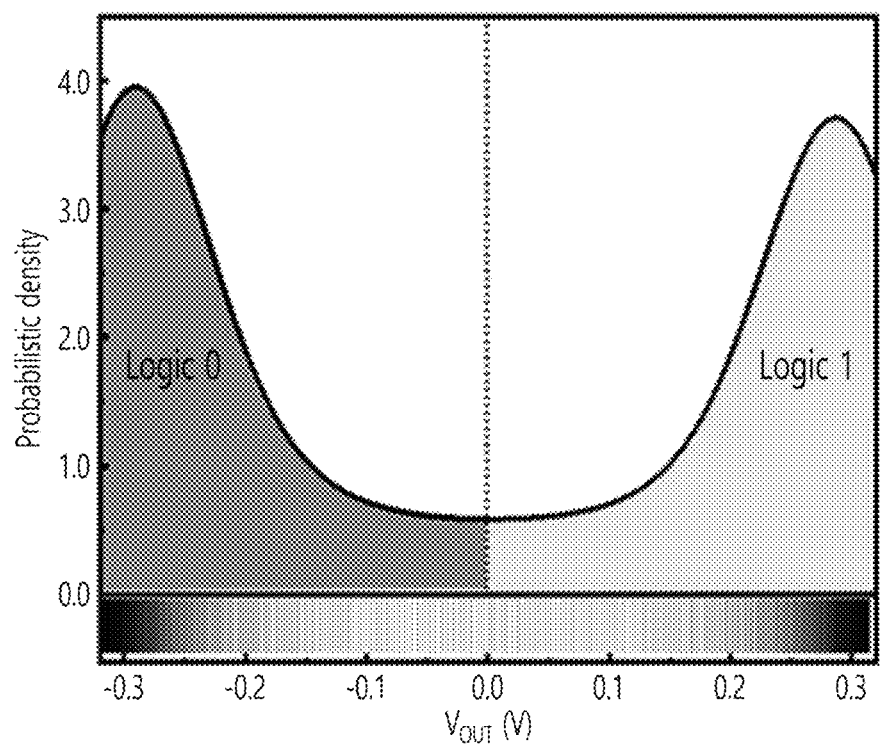
FIG. 8B illustrates an example of describing a probabilistic density function of random numbers of a ring oscillator configured with a feedback field-effect transistor according to an example embodiment.

FIG. 8B illustrates an example of describing a probabilistic density function of random numbers of a ring oscillator configured with a feedback field-effect transistor according to an example embodiment.

FIG. 8B illustrates a computation result of a probabilistic density function of random numbers of a ring oscillator configured with a feedback field-effect transistor according to an example embodiment.

Referring to FIG. 8B, a graph 810 shows that probability distribution of random output values generated through the ring oscillator is divided into two regions (logic "0" region and logic "1" region) based on OV.

Since the probability distribution of each region is close to 50%, a true random number generator (TRNG) and a physical unclonable function (PUF) may be implemented.

That is, a plurality of inverters constituting the ring oscillator is formed at the valley and the ridge of oscillation based on probabilistic density of random output values according to the hold operation as an oscillation waveform according to an oscillation operation is similar to a sine wave, and divides probability distribution into a positive logic operation value and a negative logic operation value and outputs a random output value such that a ratio of the positive logic operation value and the negative logic operation value is close to 1:1.

Therefore, the example embodiment may provide true random number generator (TRNG) and physical unclonable function (PUF) implementation technology that simultaneously performs pure random number generation and storage functions using a feedback field-effect transistor that has excellent device stability and performs a switching function and a memory function in a single device.

Also, the example embodiment may improve a data security issue in a data-centric application, such as artificial intelligence and Internet of things (IoT) and to implement a single ring oscillator that performs all of an oscillation function and a memory function using a feedback field-effect transistor with excellent stability to which an existing complementary metal-oxide semiconductor (CMOS) manufacturing process is applicable.

Figure 9:
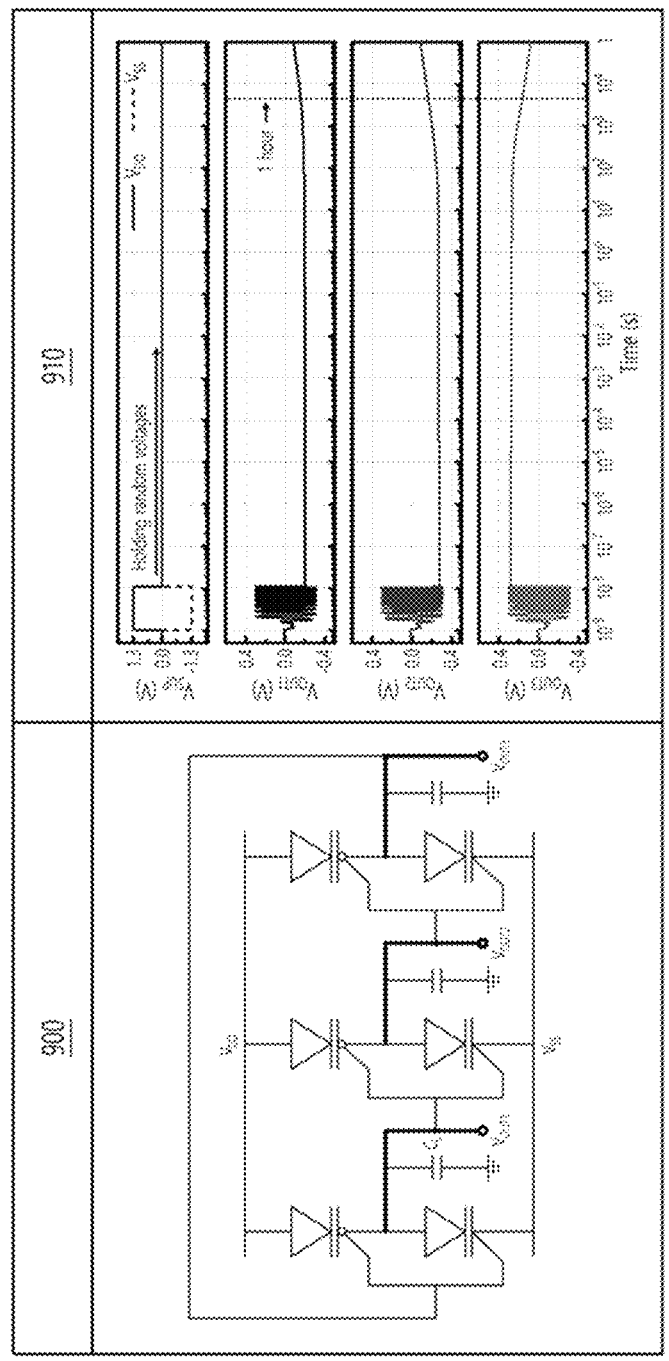
FIG. 9 illustrates an example of describing a random number storage time of a ring oscillator configured with a feedback field-effect transistor according to an example embodiment.

FIG. 9 illustrates an example of describing a random number storage time of a ring oscillator configured with a feedback field-effect transistor according to an example embodiment.

FIG. 9 illustrates a random number storage time of a ring oscillator configured with a feedback field-effect transistor according to an example embodiment.

Referring to FIG. 9, a ring oscillator circuit 900 is illustrated and an output result from the ring oscillator circuit 900 is shown as a graph 910.

The graph 910 shows that it is advantages in terms of power consumption due to a semi/non-volatile characteristic of storing a random number generated through external voltage for a long time through a memory function of the feedback field-effect transistor constituting the ring oscillator circuit 900.

Also, it can be verified that since the ring oscillator circuit 900 stores a random number inside the circuit itself, there is no need to transmit an encryption key to a memory unit, making it possible to develop a PUF with a high level of security.

Also, the ring oscillator circuit 900 may demonstrate a dual function of generating and storing random voltage during power ON-and-OFF cycles using a logic-in-memory (LIM) function of the feedback field-effect transistor.

The ring oscillator circuit 900 may generate an arbitrary analog voltage signal and may store a value thereof with a significant retention time.

The ring oscillator circuit 900 shows a self-storage function of random variables with a retention time of about 5500 seconds.

Therefore, the example embodiment may implement a ring oscillator available for next-generation artificial intelligence computing technology by reducing standby power using an excellent memory characteristic of a feedback field-effect transistor and by increasing computational efficiency with low power consumption through an excellent switching characteristic.

In the specific example embodiments, components included in the invention are expressed in singular or plural forms depending on a presented specific example embodiment.

However, the singular or plural expression is appropriately selected for a presented situation for convenience of description. The example embodiments are not construed as being limited to singular or plural components. Even a component expressed in a plural expression may be configured in a singular form, or a component expressed in a singular form may be configured in a plural form.

While the present invention is described with reference to specific example embodiments, it will be apparent to one of ordinary skill in the art that various changes and modifications in forms and details may be made in these example embodiments without departing from the technical spirit of the various example embodiments.

Therefore, other implementations, other example embodiments, and equivalents of the claims are to be construed as being included in the claims.

What is claimed is:

1. A feedback field-effect transistor-based ring oscillator comprising:
a plurality of feedback field-effect transistors each in which a diode structure is present as an n-channel region and a p-channel region between a drain terminal and a source terminal, a gate terminal is present in the diode structure, an operating state is determined in response to occurrence of a latch-up phenomenon or a latch-down phenomenon by a positive feedback loop in the channel region based on different voltages applied to the drain terminal and the gate terminal, respectively, and a memory characteristics that remembers a memory state is implemented as holes or electrons accumulate in a potential well in the channel region due to the positive feedback loop,
wherein the plurality of feedback field-effect transistors operates as p-channel mode when the gate terminal is present on the n-type doped channel region and operates as n-channel mode when the gate terminal is present on the p-type doped channel region, and two different types of feedback field-effect transistors operate as a single inverter, and
in a plurality of inverters formed by the plurality of feedback field-effect transistor, an output terminal of an inverter of each stage is input to an input terminal of a next stage and an oscillation operation is performed based on supply voltage applied through the drain terminal and the source terminal.

2. The feedback field-effect transistor-based ring oscillator of claim 1, wherein a single inverter among the plurality of inverters includes two different channel modes of feedback field-effect transistors, a p-channel feedback field-effect transistor and an n-channel feedback field-effect transistor, and has a structure in which each gate terminal is connected to an input terminal, and a source terminal of the p-channel feedback field-effect transistor and a drain terminal of the n-channel feedback field-effect transistor are connected to an output terminal, and is configured to output an output voltage to the output terminal in response to drain supply voltage supplied to the drain terminal, source supply voltage supplied to the source terminal, and input voltage input to the input terminal, and to, when the drain supply voltage is positive voltage and the source supply voltage is negative voltage, perform an inverter operation and output the output voltage in which the input voltage is inverted.

3. The feedback field-effect transistor-based ring oscillator of claim 2, wherein a single inverter among the plurality of inverters is configured to, when application of the drain supply voltage, the source supply voltage, and the input voltage is interrupted, perform a memory function of holding output voltage before the application is interrupted.

4. The feedback field-effect transistor-based ring oscillator of claim 2, wherein, in the n-channel feedback field-effect transistor, when the source supply voltage is negative voltage and when gate voltage increases in a positive voltage direction, the latch-up phenomenon occurs due to the positive feedback loop and when the gate voltage decreases in a negative voltage direction, the positive feedback loop is interrupted and the latch-down phenomenon occurs.

5. The feedback field-effect transistor-based ring oscillator of claim 2, wherein, in the p-channel feedback field-effect transistor, when the drain supply voltage is positive voltage and when gate voltage increases in a negative voltage direction, the latch-up phenomenon occurs due to the positive feedback loop and when the gate voltage decreases in a positive voltage direction, the positive feedback loop is interrupted and the latch-down phenomenon occurs.

6. The feedback field-effect transistor-based ring oscillator of claim 1, wherein the plurality of inverters is configured to, when drain supply voltage supplied to the drain terminal is positive voltage and source supply voltage supplied to the source terminal is negative voltage, perform an inverter operation and perform the oscillation operation accordingly.

7. The feedback field-effect transistor-based ring oscillator of claim 6, wherein the drain supply voltage is applied at 1.2V to 1.4V, and the source supply voltage is applied at −1.2V to −1.4V.

8. The feedback field-effect transistor-based ring oscillator of claim 6, wherein the plurality of inverters is configured to increase a speed of the oscillation operation in response to an increase in the drain supply voltage and the source supply voltage.

9. The feedback field-effect transistor-based ring oscillator of claim 6, wherein the plurality of inverters is configured to continue the oscillation operation when the drain supply voltage and the source supply voltage are applied, to perform a hold operation of holding and outputting an output value being output to an output terminal before interruption when application of the drain supply voltage and the source supply voltage is interrupted, to resume the oscillation operation when the drain supply voltage and the source supply voltage are applied again, and to generate a random output value within the oscillation range every hold operation when the interruption and the resume are repeated.

10. The feedback field-effect transistor-based ring oscillator of claim 9, wherein the plurality of inverters includes a semi/non-volatile characteristic of storing a random number by storing the random output value based on the memory characteristic.

11. The feedback field-effect transistor-based ring oscillator of claim 10, wherein the plurality of inverters is formed at the valley and the ridge of oscillation based on probabilistic density of random output values according to the hold operation as an oscillation waveform according to the oscillation operation is similar to a sine wave, and is configured to divide probability distribution in the probabilistic density into a positive logic operation value and a negative logic operation value based on reference voltage and to output the random output value such that a ratio of the positive logic operation value and the negative logic operation value is close to 1:1.

* * * * *